United States Patent
Li

(10) Patent No.: US 10,666,272 B2
(45) Date of Patent: May 26, 2020

(54) COT CONTROL CIRCUIT AND ASSOCIATED DC-DC CONVERTER

(71) Applicant: Chengdu Monolithic Power Systems Co., Ltd., Chengdu (CN)

(72) Inventor: Lei Li, Chengdu (CN)

(73) Assignee: Chengdu Monolithic Power Systems Co., Ltd., Chengdu (CN)

(*) Notice: Subject to any disclaimer, the term of this patent is extended or adjusted under 35 U.S.C. 154(b) by 64 days.

(21) Appl. No.: 15/805,077

(22) Filed: Nov. 6, 2017

(65) Prior Publication Data

US 2018/0131379 A1    May 10, 2018

(30) Foreign Application Priority Data

Nov. 8, 2016  (CN) .......................... 2016 1 0979146

(51) Int. Cl.
  *H03L 7/093*  (2006.01)
  *H02M 1/08*  (2006.01)
  *H02M 3/156*  (2006.01)
  *H03K 5/24*  (2006.01)

(52) U.S. Cl.
  CPC .............. *H03L 7/093* (2013.01); *H02M 1/08* (2013.01); *H02M 3/156* (2013.01); *H03K 5/24* (2013.01)

(58) Field of Classification Search
  CPC .......... H03L 7/093; H02M 1/08; H02M 3/156
  See application file for complete search history.

(56) References Cited

U.S. PATENT DOCUMENTS

| 2010/0079123 A1* | 4/2010 | Miyamae | H02M 3/156 323/282 |
|---|---|---|---|
| 2017/0133919 A1 | 5/2017 | Li | |
| 2018/0041117 A1 | 2/2018 | Gong | |

* cited by examiner

*Primary Examiner* — Lincoln D Donovan
*Assistant Examiner* — Colleen J O Toole
(74) *Attorney, Agent, or Firm* — Perkins Coie LLP

(57) ABSTRACT

A COT control circuit for DC-DC converter. The COT control circuit has a synchronizing signal generator, an on time generator and a frequency locking circuit. The synchronizing signal generator generates a synchronizing signal and a frequency-modulated signal. The on time generator receives an input voltage signal, an output voltage signal, an error signal and the frequency-modulated signal to generate an on time signal. The error signal is generated by the frequency locking circuit based on the on time signal and the synchronizing signal. The operation frequency of a steady state of the DC-DC converter is regulated through changing the value of the frequency-modulated signal.

15 Claims, 9 Drawing Sheets

COT CONTROL CIRCUIT AND ASSOCIATED DC-DC CONVERTER

CROSS-REFERENCE TO RELATED APPLICATION

This application claims the benefit of CN application No. 201610979146.4, filed on Nov. 8, 2016, and incorporated herein by reference.

TECHNICAL FIELD

The present invention generally refers to electrical circuit, and more particularly but not exclusively refers to COT control circuit and DC-DC converter with COT control.

BACKGROUND

In power conversion applications, constant on time (COT) control is widely used in DC-DC converters since COT control has a simple control loop with fast dynamic response. Traditionally, the COT control for a DC-DC converter is a variable frequency control. Specially, a switch of the DC-DC converter having COT control has a constant on-time, and the duty cycle of the switch is regulated through changing the switching frequency of the switch. Thus, an output voltage of the DC-DC converter is regulated through changing the duty cycle of the switch. For a better stability of the system, in an improved COT control, the DC-DC converter is set to have a constant operation frequency and the duty cycle of the switch is regulated with the changes varied in the input voltage and the output voltage of the DC-DC converter.

As shown in FIG. 1, a DC-DC converter 50 having a COT control circuit is illustrated. The COT control circuit comprises a comparing circuit 51, an on time generator 52 and a logic circuit 53. The on time generator 52 is used to generate an on time signal TON based on an output voltage signal VOUT and an input voltage signal VIN of the DC-DC converter 50. And the operating frequency of the DC-DC converter 50 is set by a resistor and a capacitor of the on time generator 52. Generally, the on time generator 52 is integrated on a monolithic chip. Thus, it is hard to flexibly change the operating frequency of the DC-DC converter 50 in different operation conditions due to the integrated resistor and capacitor of the on time generator 52.

Therefore, it is desired to have a solution for flexibly changing the operating frequency of the DC-DC converter with COT control.

SUMMARY

Embodiments of the present invention are directed to a COT control circuit for a DC-DC converter, comprising: a synchronizing signal generator, configured to generate a frequency-modulated signal and a synchronizing signal, wherein an operation frequency of a steady state of the DC-DC converter is regulated through changing the value of the frequency-modulated signal; an on time generator, configured to receive an input voltage signal, an output voltage signal, an error signal and the frequency-modulated signal to generate an on time signal, wherein the on time signal is configured to control the on time of at least one controllable switch of the DC-DC converter, and wherein the input voltage signal is converted to the output voltage signal through switching the at least one controllable switch on and off; and a frequency locking circuit, configured to receive the on time signal and the synchronizing signal, and further configured to compare the frequency of the on time signal with the frequency of the synchronizing signal to generate the error signal.

Embodiments of the present invention are further directed to a DC-DC converter with COT control, wherein the DC-DC converter comprises a voltage converter integrated circuit (IC), and wherein the voltage converter IC comprises: at least one controllable switch, wherein an input voltage signal of the DC-DC converter is converted to an output voltage signal of the DC-DC converter through switching the at least one controllable switch on and off; a synchronizing signal generator, configured to generate a frequency-modulated signal and a synchronizing signal, wherein an operation frequency of a steady state of the DC-DC converter is regulated through changing the value of the frequency-modulated signal; an on time generator, configured to receive the input voltage signal, the output voltage signal, an error signal and the frequency-modulated signal to generate an on time signal, wherein the on time signal is configured to control the on time of the at least one controllable switch; and a frequency locking circuit, configured to receive the on time signal and the synchronizing signal, and further configured to compare the frequency of the on time signal with the frequency of the synchronizing signal to generate the error signal.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The phrase "couple" includes direct connection and indirect connection. Indirect connection includes connection through conductor which has resistance and/or parasitic parameters such as inductance and capacitance, or connection through diode, and so on.

Figure 1:
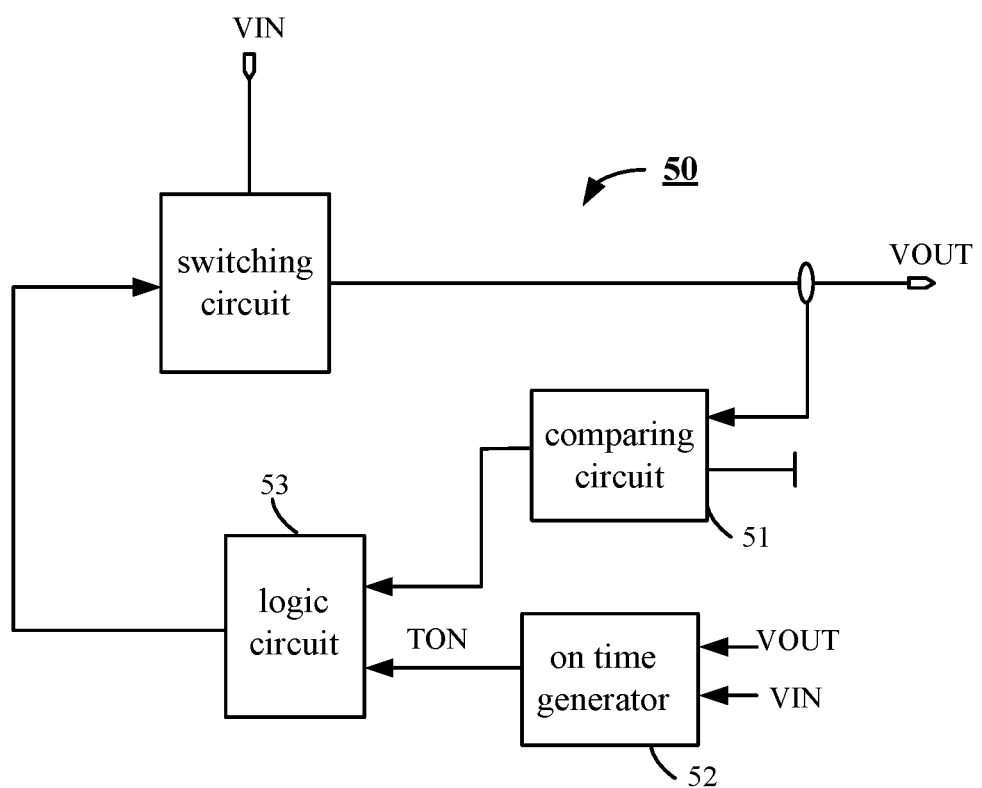
FIG. 1 schematically illustrates a prior DC-DC converter 50 with COT control.
Figure 2:
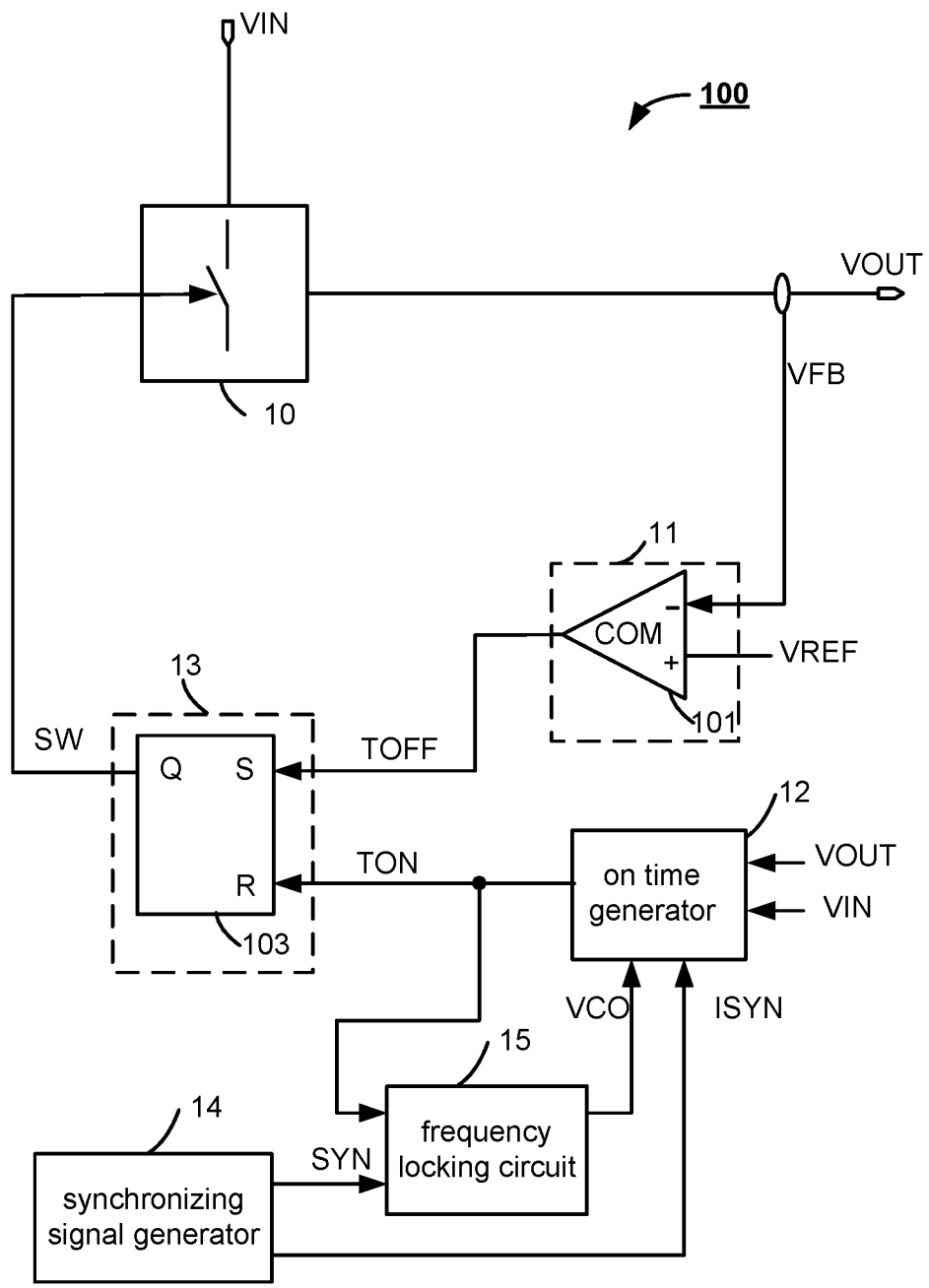
FIG. 2 schematically illustrates a DC-DC converter 100 with COT control in accordance with an embodiment of the present invention.

FIG. 2 schematically illustrates a DC-DC converter 100 with COT control in accordance with an embodiment of the present invention. As shown in FIG. 2, the DC-DC converter 100 may comprise a switching circuit 10 and a control circuit. The switching circuit 10 may comprise at least one controllable switch. An input voltage signal VIN of the DC-DC converter 100 is converted to an output voltage signal VOUT of the DC-DC converter 100 through switching the at least one switch on and off. In the exemplary embodiment of FIG. 2, the switching circuit 10 could be illustrated to have a BUCK topology, a BOOST topology, a BUCK-BOOST topology or other suitable topologies. The control circuit may comprise a comparing circuit 11, an on time generator 12, a logic circuit 13, a synchronizing signal generator 14 and a frequency locking circuit 15.

In the exemplary embodiment of FIG. 2, the comparing circuit 11 may be configured to receive a voltage feedback signal VFB and a voltage reference signal VREF, and further configured to compare the voltage feedback signal VFB with the voltage reference signal VREF to generate a comparing signal TOFF. In an embodiment, the comparing signal TOFF may comprise a logic signal with a logic high state and a logic low state. When the comparing signal TOFF is changed from the logic low state to the logic high state, the at least one controllable switch (e.g., a high-side switch of a BUCK switching circuit) is turned on. In an embodiment, the comparing circuit 11 may comprise a voltage comparator 101 having a non-inverting terminal configured to receive the voltage reference signal VREF, an inverting terminal configured to receive the feedback signal VFB. The voltage comparator 101 may be configured to compare the voltage feedback signal VFB with the voltage reference signal VREF to generate the comparing signal TOFF. When the feedback signal VFB is decreased to the voltage reference signal VREF, the comparing signal TOFF is changed from the logic low state to the logic high state so as to turn the at least one controllable switch on.

In the exemplary embodiment of FIG. 2, the on time generator 12 may be configured to receive the input voltage signal VIN, the output voltage signal VOUT, an error signal VCO and a frequency-modulated signal ISYN to generate an on time signal TON. The on time signal TON may comprise a logic signal with a logic high state and a logic low state. In an embodiment, when the on time signal TON is changed from the logic low state to the logic high state, the at least one controllable switch (e.g., a high-side switch of a BUCK switching circuit) is turned off.

The logic circuit 13 may be configured to receive the comparing signal TOFF and the on time signal TON, and configured to conduct a logic operation to the comparing signal TOFF and the on time signal TON to generate the control signal SW to control the at least one controllable switch. In an embodiment, the logic circuit 13 may be illustrated as a RS flip-flop 103. The RS flip-flop 103 may comprise a set terminal S configured to receive the comparing signal TOFF, a reset terminal R configured to receive the on time signal TON, and an output terminal Q configured to provide the control signal SW.

The synchronizing signal generator 14 may be configured to generate the frequency-modulated signal ISYN and a synchronizing signal SYN. In the exemplary embodiment of FIG. 2, the frequency-modulated signal ISYN and the synchronizing signal SYN are configured to regulate the operation frequency of the DC-DC converter 100, i.e., the switching frequency of the at least one controllable switch of the switching circuit 11. Specifically, the frequency-modulated signal ISYN may be configured to set the operation frequency of a steady state of the DC-DC converter 100. For example, the operation frequency of the steady state of the DC-DC converter 100 can be regulated between 300K-2M HZ through changing the value of the frequency-modulated signal ISYN. In an embodiment, the frequency-modulated signal ISYN may comprise a current signal. The synchronizing signal SYN may be configured to regulate the operation frequency of a dynamic state of the DC-DC converter 100 so as to make the operation frequency of the DC-DC converter 100 being equal to the frequency of the synchronizing signal SYN. In an embodiment, the synchronizing signal generator 14 may comprise a clock signal generator, and the synchronizing signal SYN may comprise a clock signal.

The frequency locking circuit 15 may be configured to receive the on time signal TON and the synchronizing signal SYN, and further configured to compare the frequency of the on time signal TON with the frequency of the synchronizing signal SYN to generate the error signal VCO. In an embodiment, the error signal VCO may be a voltage signal which is representative of the frequency difference between the frequency of the on time signal TON and the frequency of the synchronizing signal SYN. The frequency locking circuit 15 is configured to regulate the frequency of the on time signal TON so as to make the frequency of the on time signal TON is equal to the frequency of the synchronizing signal SYN. In an embodiment, the frequency locking circuit 15 comprises a Phase Locking Loop (PLL). Besides comparing the frequency of the on time signal TON and the frequency of the synchronizing signal SYN, the PLL is further configured to compare the phase of the on time signal TON with the phase of the synchronizing signal SYN. In such a condition, the on time signal TON is regulated to synchronize with the synchronizing signal SYN, i.e., the frequency of the on time signal TON is equal to the frequency of the synchronizing signal SYN, and the phase of the on time signal TON is equal to the phase of the synchronizing signal SYN.

Figure 3:
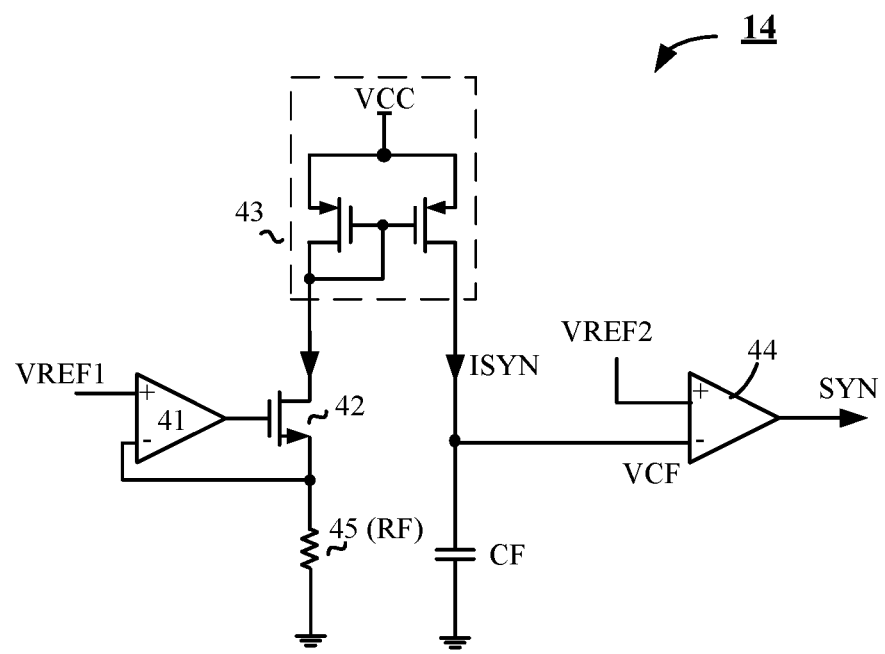
FIG. 3 schematically illustrates the synchronizing signal generator 14 of FIG. 2 in accordance with an embodiment of the present invention.

FIG. 3 schematically illustrates the synchronizing signal generator 14 of FIG. 2 in accordance with an embodiment of the present invention. In the exemplary embodiment of FIG. 3, the synchronizing signal generator 14 may comprise an operational amplifier 41, a transistor 42, a current mirror 43, a voltage comparator 44, a frequency-modulated resistor 45 with resistance RF, and a frequency-modulated capacitor CF.

The operational amplifier 41 may have a first input terminal configured to receive a first reference voltage signal VREF1, a second input terminal connected to the logic ground through the frequency-modulated resistor 45, and an output terminal coupled to the gate of the transistor 42. The drain of the transistor 42 is coupled to a first terminal of the current mirror 43, and the source of the transistor 42 is connected to the logic ground through the frequency-modulated resistor 45. The operational amplifier 41, the transistor 42 and the current mirror 43 are configured to generate a current signal at the first terminal of the current mirror 43. The current mirror 43 is configured to mirror the current signal to generate the frequency-modulated signal ISYN at the second terminal of the current mirror 43, and the frequency-modulated signal ISYN has a relationship with the first reference voltage signal VREF1 as follow:

$$ISYN = \frac{VREF1}{RF} \tag{1}$$

The frequency-modulated capacitor CF is coupled between the logic ground and the second terminal of the current mirror 43. The frequency-modulated signal ISYN may be configured to charge the frequency-modulated capacitor CF to generate a frequency-modulated voltage signal VCF. The voltage comparator 44 may have a first input terminal configured to receive a second reference voltage signal VREF2, a second input terminal configured to receive the frequency-modulated voltage signal VCF, and an output terminal. The voltage comparator 44 may be configured to compare the second reference voltage signal VREF2 with the frequency-modulated voltage signal VCF to generate the synchronizing signal SYN.

Generally, the operational amplifier 41, the transistor 42, the current mirror 43, the voltage comparator 44, and the frequency-modulated capacitor CF are integrated on a monolithic chip, and only the frequency-modulated resistor 45 is remained in the external of the monolithic chip. Consequently, the value of the frequency-modulated signal ISYN and the frequency of the synchronizing signal SYN can be changed through regulating the resistance RF of the frequency-modulated resistor 45. In the exemplary embodiment of FIG. 3, the first reference voltage signal VREF1 and the second reference voltage signal VREF2 can be set to be equal or unequal in the different operation conditions. In an embodiment, for example, when the frequency-modulated capacitor CF is set to have a capacitance value of 5 pF, and both the first reference voltage signal VREF1 and the second reference voltage signal VREF2 have a voltage value of 1.2 Volts, in order to generate the synchronizing signal SYN having a frequency value of 500 k HZ, the resistance RF of the frequency-modulated resistor 45 should be equal to 166 k Ohms. And the frequency value of the synchronizing signal SYN can be easily changed from 500 k HZ to 300 k HZ by changing the resistance RF of the frequency-modulated resistor 45 from 166 k Ohms to 278 k Ohms.

Figure 4:
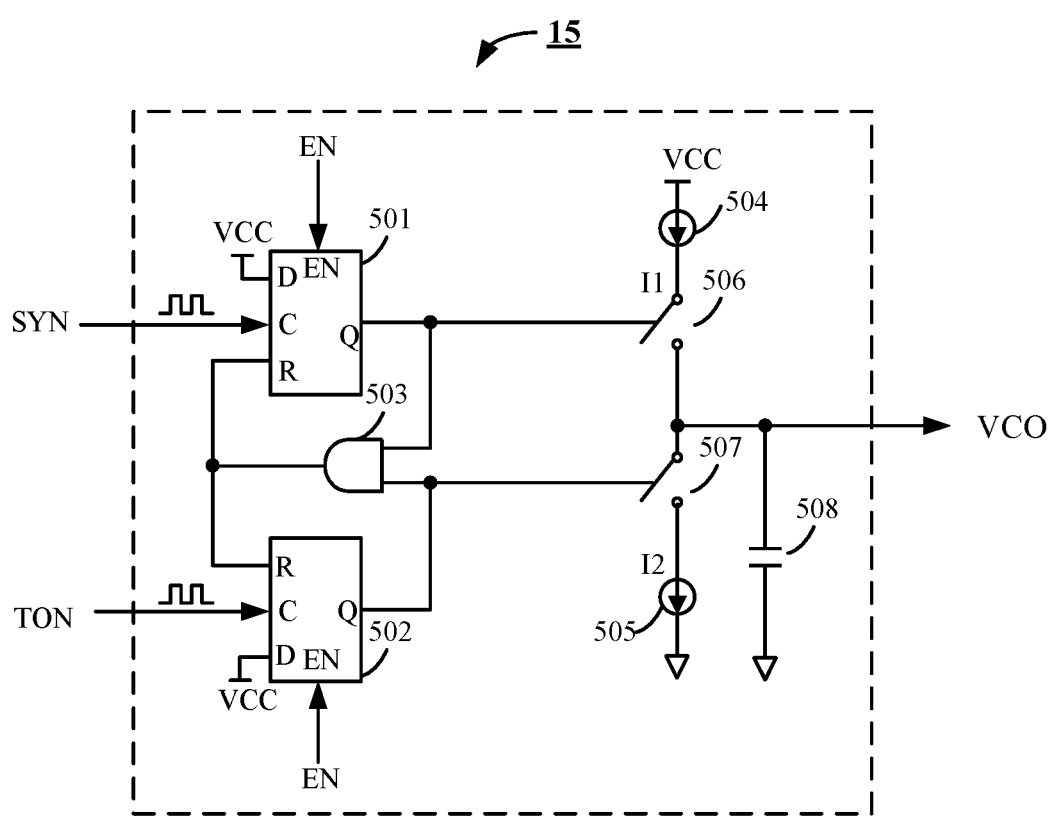
FIG. 4 schematically illustrates the frequency locking circuit 15 of FIG. 2 in accordance with an embodiment of the present invention.

FIG. 4 schematically illustrates the frequency locking circuit 15 of FIG. 2 in accordance with an embodiment of the present invention. In the exemplary embodiment of FIG. 4, the frequency locking circuit 15 is illustrated to have the PLL topology. As shown in FIG. 4, the frequency locking circuit 15 may comprise a first D flip-flop 501, a second D flip-flop 502, an AND gate 503, a first current source 504, a second current source 505, a first switch 506, a second switch 507 and a capacitor 508. The first D flip-flop 501 and the second D flip-flop 502 respectively have a first terminal D, a second terminal C, a third terminal R, an enable terminal EN and an output terminal Q. The first terminals D of the first D flip-flop 501 and the second D flip-flop 502 may be configured to receive a supply voltage signal VCC. The second terminal C of the first D flip-flop 501 may be configured to receive the synchronizing signal SYN. The second terminal C of the second D flip-flop 502 may be configured to receive the on time signal TON. The third terminals R of the first D flip-flop 501 and second D flip-flop 502 may be coupled together. The enable terminals EN of the first D flip-flop 501 and the second D flip-flop 502 may be configured to receive the enable signal EN. When the enable signal EN is in the active state, the first D flip-flop 501 and second D flip-flop 502 are activated to operate. In the exemplary embodiment of FIG. 4, the second terminal C of the first D flip-flop 501 is operated as a first input terminal of the PLL, and the second terminal C of the second D flip-flop 502 is operated as a second input terminal of the PLL. The AND gate 503 may have a first input terminal coupled to the output terminal Q of the first D flip-flop 501, a second input terminal coupled to the output terminal Q of the second D flip-flop 502, an output terminal coupled to the third input terminals R of the first D flip-flops 501 and the second D flip-flops 502. The first switch 506 and the second switch 507 may respectively comprise a first terminal, a second terminal and a control terminal. The first terminals of the first switch 506 and the second switch 507 are coupled together. The control terminal of the first switch 506 may be coupled to the output terminal Q of the first D flip-flop 501. The control terminal of the second switch 507 may be coupled to the output terminal Q of the second D flip-flop 502. In an embodiment, the first switch 506 and the second switch 507 may comprise transistors, for example, the first switch 506 is a P-transistor and the second switch 507 is an N-transistor. The first current source 504 may be coupled between the second terminal of the first switch 506 and the supply voltage VCC. The second current source 505 may be coupled between the second terminal of the second switch 507 and a logic ground. The capacitor 508 may be coupled between the logic ground and the first terminals of the first switch 506 and the second switch 507. In an embodiment, the first current source 504 is configured to charge the capacitor 508 when the first switch 506 is turned on, and the second current source 505 is configured to discharge the capacitor 508 when the second switch 507 is turned on. The common connection of the capacitor 508 and the first terminals of the first switch 506 and the second switch 507 may be operated as the output terminal of the PLL 15, and the voltage across the capacitor 508 is operated as the error signal VCO.

Figure 5:
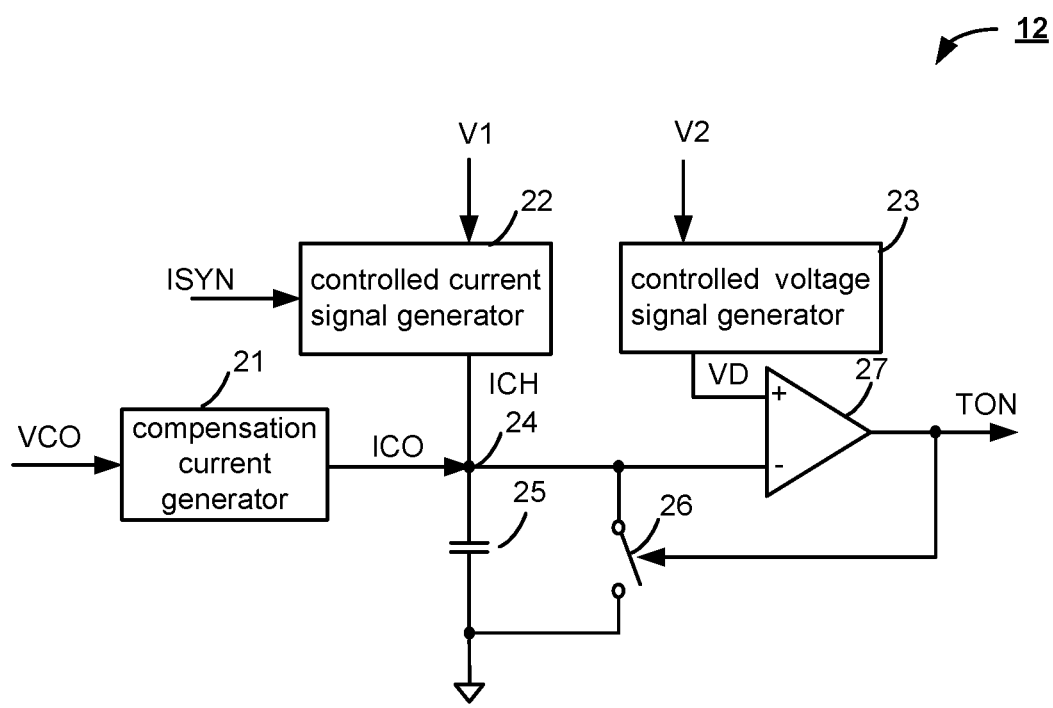
FIG. 5 schematically illustrates the on time generator 12 of FIG. 2 in accordance with an embodiment of the present invention.

FIG. 5 schematically illustrates the on time generator 12 of FIG. 2 in accordance with an embodiment of the present invention. In the exemplary embodiment of FIG. 5, the on time generator 12 may comprise a compensation current generator 21, a controlled current signal generator 22, a controlled voltage signal generator 23, a node 24, a capacitor 25, a reset switch 26, and a voltage comparator 27.

In the exemplary embodiment of FIG. 5, the compensation current generator 21 may be configured to receive the error signal VCO to generate a compensation current signal ICO. The controlled current signal generator 22 may be configured to receive the frequency-modulated signal ISYN and a first voltage signal V1 to generate a charging current signal ICH. The capacitor 25 may be connected between the controlled current signal generator 22 and the logic ground. The common connection of the controlled current signal generator 22 and the capacitor 25 is labeled as the node 24. An output terminal of the compensation current generator 21 may be coupled to the node 24. The reset switch 26 may be coupled between the node 24 and the logic ground. The controlled voltage signal generator 23 may be configured to receive a second voltage signal V2 to generate a controlled voltage signal VD. The voltage comparator 27 may have a first input terminal configured to receive the controlled voltage signal VD, a second input terminal coupled to the node 24 to receive the voltage across the capacitor 25, and an output terminal. The charge comparator 27 may be configured to compare the controlled voltage signal VD with the voltage across the capacitor 25 to generate the on time signal TON at the output terminal of the charge comparator 27.

In the exemplary embodiment of FIG. 5, the first voltage signal V1 and the second voltage signal V2 are related to the topology that the switching circuit 10 is illustrated to have. In an embodiment, when the switching circuit 10 is illustrated to have a BUCK topology, the on time signal TON is proportional to the output voltage signal VOUT and inversely proportional to the input voltage signal VIN. In such a condition, the first voltage signal V1 may comprise the input voltage signal VIN, and the charging current signal ICH is proportional to the input voltage signal VIN; the second voltage signal V2 may comprise the output voltage signal VOUT, and the controlled voltage signal VD is proportional to the output voltage signal VOUT.

In another embodiment, when the switching circuits 10 is illustrated to have a BOOST topology, the on time signal TON is proportional to the difference of the output voltage signal VOUT and the input voltage signal VIN (i.e., VOUT-VIN), and inversely proportional to the output voltage signal VOUT. In such a condition, the first voltage signal V1 may comprise the output voltage signal VOUT, and the charging current signal ICH is proportional to the output voltage signal VOUT; the second voltage signal V2 may comprise the input voltage signal VIN and the output voltage signal, and the controlled voltage signal VD is proportional to the difference of the output voltage signal VOUT and the input voltage signal VIN (i.e., VOUT-VIN).

Figure 6:
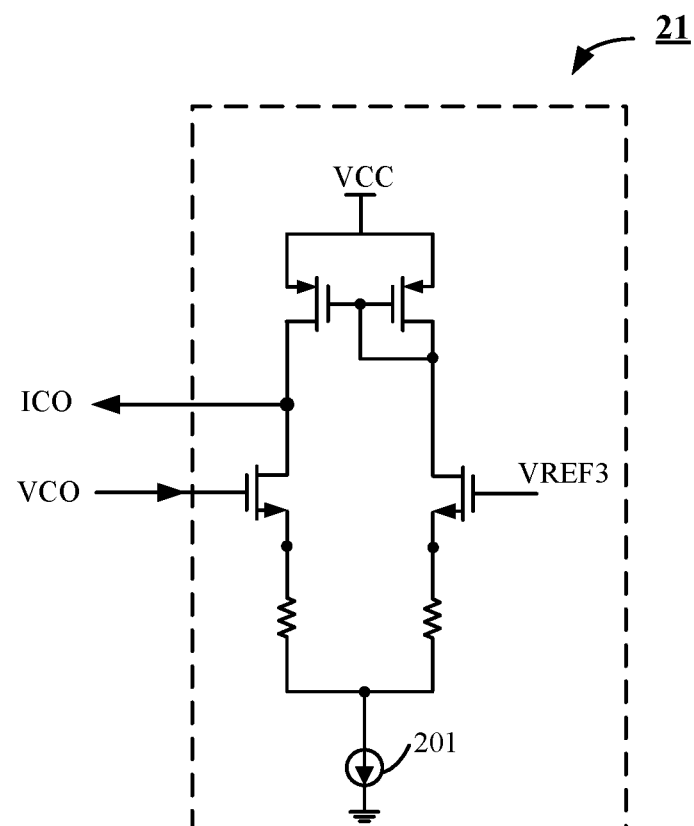
FIG. 6 schematically illustrates the compensation current generator 21 of FIG. 5 in accordance with an embodiment of the present invention.

FIG. 6 schematically illustrates the compensation current generator 21 of FIG. 5 in accordance with an embodiment of the present invention. In the exemplary embodiment of FIG. 6, the compensation current generator 21 may comprise a differential transconductance amplifier which is configured to compare the error signal VCO with a third reference voltage VREF3 to generate the compensation current signal ICO. Specially, the compensation current signal ICO is equal to the error signal VCO divided by a resistance. Thus, the compensation current signal ICO is proportional to the error signal VCO. In an embodiment, the compensation current signal ICO is representative of the frequency difference of the frequency of the on time signal TON and the frequency of the synchronizing signal SYN. In another embodiment, the compensation current signal ICO is representative of the phase difference of the phase of the on time signal TON and the phase of the synchronizing signal SYN.

Figure 7:
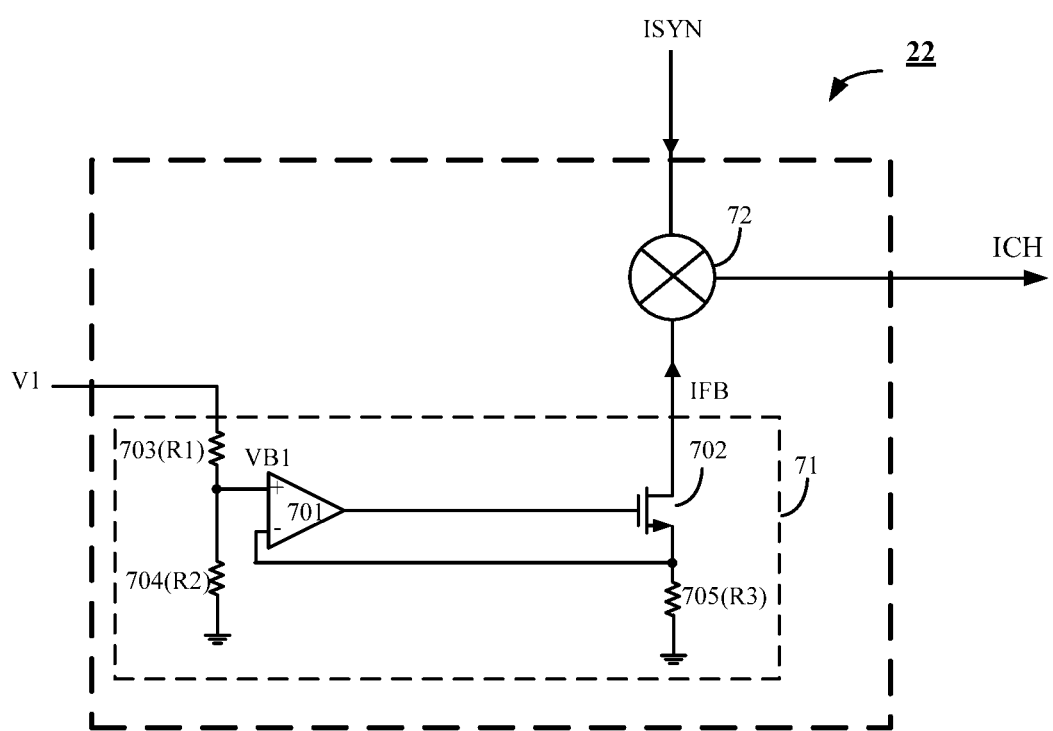
FIG. 7 schematically illustrates the controlled current signal generator 22 of FIG. 5 in accordance with an embodiment of the present invention.

FIG. 7 schematically illustrates the controlled current signal generator 22 of FIG. 5 in accordance with an embodiment of the present invention. In the exemplary embodiment of FIG. 7, the controlled current signal generator 22 may comprise a feedback current generator 71 and a multiplier 72.

The feedback current generator 71 may comprise an operational amplifier 701, a transistor 702, a resistor 703 with resistance R1, a resistor 704 with resistance R2 and a resistor 705 with resistance R3. The first resistor 701 and the second transistor 702 connected in series between an input terminal of the controllable current signal generator 22 and the logic ground are configured to divide the first voltage signal V1 to generate a voltage signal VB1 at a common node of the first resistor 703 and the second transistor 704. The operational amplifier 701 may have a first input terminal configured to receive the voltage signal VB1, a second input terminal connected to the logic ground through the resistor 705, and an output terminal. The source of the transistor 702 is connected to the logic ground through the resistor 705, the gate of the transistor 702 is coupled to the output terminal of the operational amplifier 701, and the drain of the transistor 702 is operated as an output terminal of the feedback current generator 71 for providing a feedback current signal IFB, wherein the feedback current signal IFB has a relationship with the first voltage signal V1 as follow:

$$IFB = \frac{V1 \times R2}{(R1+R2) \times R3} \quad (2)$$

The multiplier 72 may be configured to receive the feedback current signal IFB and the frequency-modulated signal ISYN, and further configured to conduct a logic operation to the feedback current signal IFB and the frequency-modulated signal ISYN to generate the charging current signal ICH. The equation is shown as follow:

$$ICH = km \times ISYN \times IFB \quad (3)$$

Wherein, km is a proportionality coefficient of the multiplier 72. The charging current signal ICH is proportional to the feedback current signal IFB and the frequency-modulated signal ISYN. Consequently, the charging current signal ICH can be varied in the frequency-modulated signal ISYN.

The relationship of the charging current signal ICH, the feedback current signal IFB and the frequency-modulated signal ISYN can be deduced by combining with the equations (2)-(3), and the newly generated equation is shown as follow:

$$ICH = \frac{km \times V1 \times R2 \times ISYN}{(R1+R2) \times R3} \quad (4)$$

Back to the embodiment of FIG. 5, the on time signal TON has a relationship with the charging current signal ICH and the controlled voltage signal VD as follow:

$$ICH \times TON = C \times VD \quad (5)$$

Wherein, C is representative of the capacitance value of the capacitor 25. It should be noted that comparing with the value of the charging current ICH, the value of the compensation current signal ICO can be ignored, thus, in the equation (5), the compensation current signal ICO acting on the frequency of the switching DC-DC converter 100 can be ignored. As we known, the on time signal TON has a relationship with the switch cycle T of the switching DC-DC converter 100 as follow:

$$TON = D \times T \quad (6)$$

Wherein, D is representative of the duty cycle of the switching DC-DC converter 100. In accordance with the equations (4)-(6), the switch cycle T of the switching DC-DC converter 100 can be deduced as below:

$$T = \frac{C \times VD \times (R1+R2) \times R3}{V1 \times R2 \times ISYN \times D \times km} \quad (7)$$

As mentioned above, when the switching circuit 10 is illustrated to have a BUCK topology, the first voltage signal V1 may be proportional to the input voltage signal VIN, e.g., V1=k1×VIN, and the controlled voltage signal VD is proportional to the output voltage signal VOUT, e.g., VD=k2×VOUT, wherein k1, k2 are proportional coefficients. The duty cycle D of the BUCK converter is equal to VOUT/VIN. Thus, the equation (7) can be transformed as below:

$$T = \frac{C \times k2 \times (R1 + R2) \times R3}{km \times k1 \times R2 \times ISYN} \quad (8)$$

Similarly, when the switching circuit 10 is illustrated to have a BOOST topology, the first voltage signal V1 may be proportional to the output voltage signal VOUT, e.g., V1=k3×VOUT, and the controlled voltage signal VD is proportional to the difference of the output voltage signal VOUT and the input voltage signal VIN, e.g., VD=k4×(VOUT−VIN), wherein k3, k4 are proportional coefficients. The duty cycle D of the BOOST converter is equal to (VOUT−VIN)/VOUT. Thus, the equation (7) can be transformed as below:

$$T = \frac{C \times k4 \times (R1 + R2) \times R3}{km \times k3 \times R2 \times ISYN} \quad (9)$$

It can get to know from equation (8) or equation (9), the switch cycle T of the switching DC-DC converter 100 has a relationship with the frequency-modulated signal ISYN. And as mentioned in equation (1), the frequency-modulated signal ISYN has a relationship with the frequency-modulated resistor 45. Therefore, the operation frequency of the switching DC-DC converter 100 can be regulated by varying the resistance RF of the frequency-modulated resistor 45.

Figure 8:
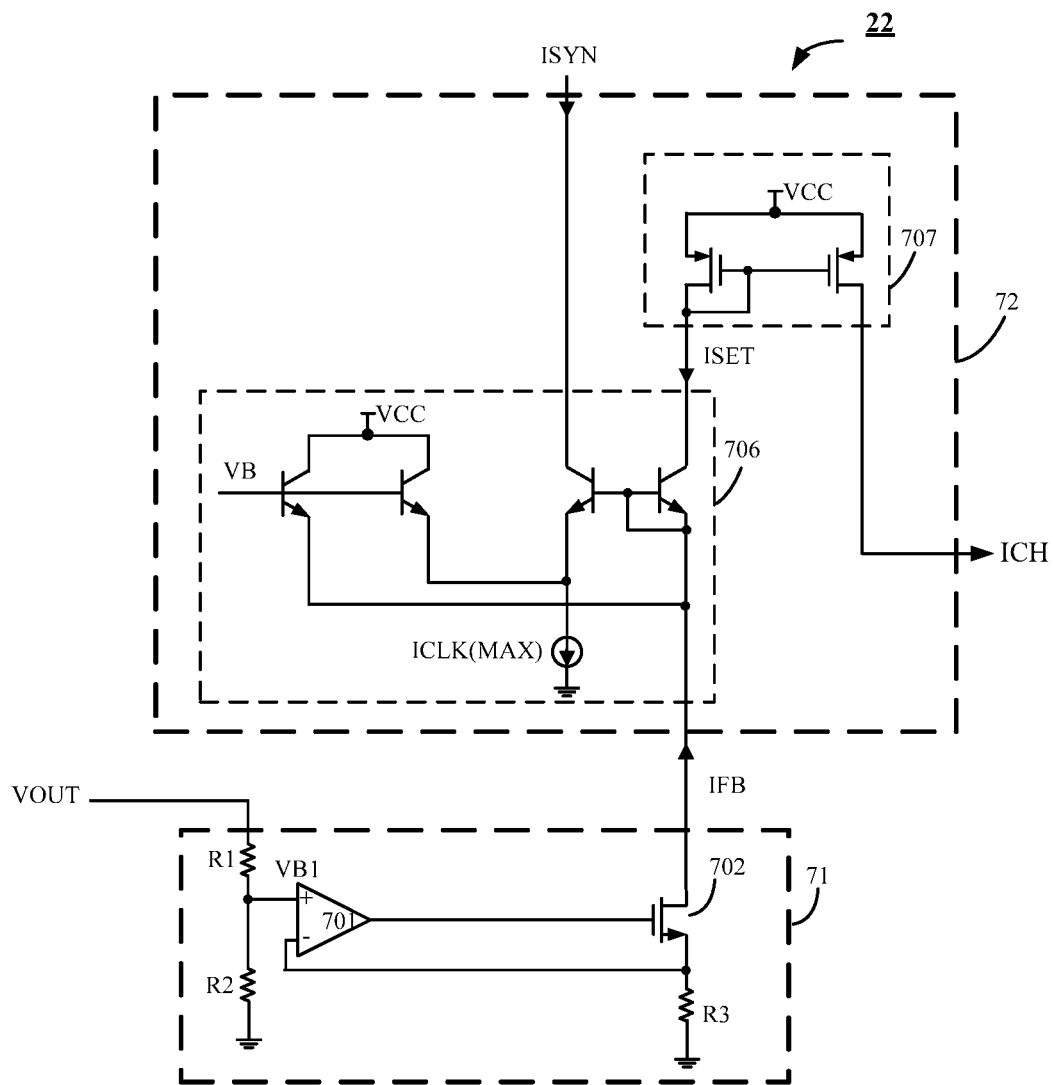
FIG. 8 schematically illustrates the controlled current signal generator 22 of FIG. 5 in accordance with an embodiment of the present invention.

FIG. 8 schematically illustrates the controlled current signal generator 22 of FIG. 5 in accordance with an embodiment of the present invention. In the exemplary embodiment of FIG. 8, the schematic diagram of the controlled current signal generator 22 is illustrated based on the BOOST topology that the switching circuit 10 may be illustrated to have. As shown in FIG. 8, the feedback current generator 71 is configured to receive the output voltage signal VOUT at an input terminal of the feedback current generator 71, and provide the feedback current signal IFB at the output terminal of the feedback current generator 71. In the exemplary embodiment of FIG. 8, the multiplier 72 may comprise Gilbert cell 706 and a current mirror 707. The Gilbert cell 706 may be configured to receive the feedback current signal IFB and the frequency-modulated signal ISYN to generate a current signal ISET. The current signal ISET can be deduced in accordance with the Gilbert cell, i.e., ISET=IFB×ISYN/ISYN(MAX), wherein ISYN(MAX) is representative of the value of the frequency-modulated signal ISYN responding to the maximum frequency of the DC-DC converter. The current mirror 707 may be configured to receive the current signal ISET, and further configured to mirror the current signal ISET to generate the charging current signal ICH.

Figure 9:
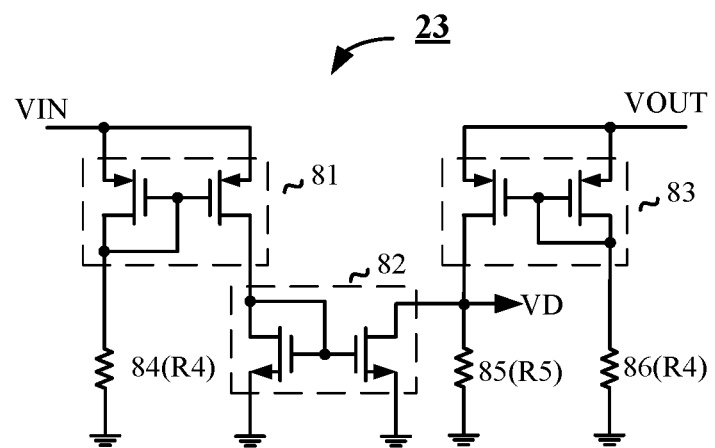
FIG. 9 schematically illustrates the controlled voltage signal generator 23 of FIG. 5 in accordance with an embodiment of the present invention.

FIG. 9 schematically illustrates the controlled voltage signal generator 23 of FIG. 5 in accordance with an embodiment of the present invention. In the exemplary embodiment of FIG. 9, the schematic diagram of the controlled voltage signal generator 23 is illustrated based on the BOOST topology that the switching circuit 10 is illustrated to have.

In the exemplary embodiment of FIG. 9, the controlled voltage signal generator 23 may comprise a first pull-up current mirror 81 having an input terminal, a first current terminal and a second current terminal, wherein the input terminal is configured to receive the input voltage signal VIN, and the first current terminal is coupled to a resistor 84 with resistance of R4; a second pull-down current mirror 82 having a current-in end and a current-out end, wherein the current-in end may be coupled to the second current terminal of the first pull-up current mirror 81; and a second pull-up current mirror 83 having an input terminal, a first current terminal and a second current terminal, wherein the input terminal is configured to receive the output voltage signal VOUT, the first current terminal is coupled to the current-out end of the pull-down current mirror 82 and to a resistor 85 with resistance of R5, and the second current terminal is coupled to a resistor 86 with resistance of R4. A voltage across the resistor 85 is operated as the controlled voltage signal VD. Thus, the controlled voltage signal VD in FIG. 9 has a relationship with the input voltage VIN and the output voltage VOUT as follow:

$$VD = \frac{(VOUT - VIN) \times R5}{R4} \quad (10)$$

Figure 10:
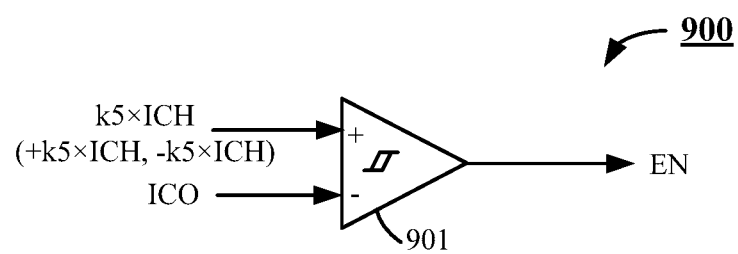
FIG. 10 schematically illustrates an enable signal generator 900 in accordance with an embodiment of the present invention.

FIG. 10 schematically illustrates an enable signal generator 900 in accordance with an embodiment of the present invention. The enable signal generator 900 may be configured to generate the enable signal EN described in the embodiment of FIG. 4. The enable signal EN may be a logic signal with a logic high state and a logic low state. In an embodiment, when the enable signal EN is in the logic high state, the frequency locking circuit 15 is activated to operate; and when the enable signal EN is in the logic low state, the frequency locking circuit 15 is inactivated to operate. Generally, when the frequency difference of the frequency of the on time signal TON and the frequency of the synchronizing signal SYN is exceeded a frequency threshold, the enable signal EN is in the logic low state so that the frequency locking circuit 15 is inactivated to operate.

As shown in FIG. 10, the enable signal generator 900 may comprise a hysteresis comparator 901 having a first input terminal configured to receive a current reference signal k5×ICH, a second input terminal configured to receive the compensation current signal ICO, and an output terminal, wherein k5 is a proportional coefficient, e.g., of 0.3. The hysteresis comparator 901 is configured to compare the current reference signal k5×ICH with the compensation current signal ICO to generate the enable signal EN at the output terminal of the hysteresis comparator 901. The current reference signal k5×ICH is configured to set a reference range of the compensation current signal ICO. When the compensation current signal ICO is changed within a range from −k5×ICH to k5×ICH, the frequency difference between the synchronizing signal SYN and the on time signal TON is smaller than the frequency threshold. For such a condition, the enable signal EN is in the active state (e.g., logic high) to enable the frequency locking circuit 15. When the compensation current signal ICO is exceeded the range from −k5×ICH to k5×ICH, the frequency difference between the synchronizing signal SYN and the on time signal TON is larger than the frequency threshold. For this condition, the enable signal EN is in the inactive state (e.g., logic low) to disable the frequency locking circuit 15.

In another embodiment, the range of the frequency difference between the synchronizing signal SYN and the on time signal TON can be regulated by other strategies. For example, the compensation current signal ICO can be limited within a range by adding a tail current source 201 in the transconductance amplifier of the compensation current generator 21 of FIG. 6. For instance, if the value of the tail current source 201 is set to be k5×ICH, the compensation current signal ICO is limited within the range from −k5×ICH to k5×ICH.

Obviously many modifications and variations of the present invention are possible in light of the above teachings. It is therefore to be understood that within the scope of the appended claims the invention may be practiced otherwise than as specifically described. It should be understood, of course, the foregoing invention relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What I claim is:

1. A constant on time (COT) control circuit for a DC-DC converter, comprising:
    a synchronizing signal generator, configured to generate a frequency-modulated signal and a synchronizing signal, wherein an operation frequency of a steady state of the DC-DC converter is regulated through changing the value of the frequency-modulated signal;
    an on time generator, configured to receive an input voltage signal, an output voltage signal, an error signal and the frequency-modulated signal to generate an on time signal, wherein the on time signal is configured to control the on time of at least one controllable switch of the DC-DC converter, and wherein the input voltage signal is converted to the output voltage signal through switching the at least one controllable switch on and off; and
    a frequency locking circuit, configured to receive the on time signal and the synchronizing signal, and further configured to compare the frequency of the on time signal with the frequency of the synchronizing signal to generate the error signal, wherein the frequency locking circuit comprises a phase locking loop (PLL), and wherein the PLL is configured to compare the frequency of the on time signal with the frequency of the synchronizing signal, and compare the phase of the on time signal with the phase of the synchronizing signal to generate the error signal.

2. The COT control circuit of claim 1, wherein the ON time generator comprises:
    a compensation current generator, configured to receive the error signal to generate a compensation current signal;
    a controlled current signal generator, configured to receive the frequency-modulated signal and a first voltage signal to generate a charging current signal;
    a capacitor, having a first terminal connected to an output terminal of the controlled current signal generator and an output terminal of compensation current generator, and a second terminal connected to a logic ground;
    a reset switch, having a first terminal coupled to the first terminal of the capacitor, a second terminal connected to the logic ground, and a control terminal configured to receive the on time signal;
    a controlled voltage signal generator, configured to receive a second voltage signal to generate a controlled voltage signal; and
    a voltage comparator, having a first input terminal configured to receive the controlled voltage signal, a second input terminal coupled to the first terminal of the capacitor, and an output terminal, and further configured to compare the controlled voltage signal with a voltage across the capacitor to generate the on time signal at the output terminal of the voltage comparator.

3. The COT control circuit of claim 2, wherein the controlled current signal generator comprises:
    a feedback current generator, configured to receive the first voltage signal to generate a feedback current signal; and
    a multiplier, configured to receive the feedback current signal and the frequency-modulated signal, and further configured to conduct a logic operation of the feedback current signal and the frequency-modulated signal to generate the charging current signal.

4. The COT control circuit of claim 2, wherein when the DC-DC converter comprises a switching circuit having a BUCK topology, the first voltage signal comprises the input voltage signal, and the charging current signal is proportional to the input voltage signal; and wherein the second voltage signal comprises the output voltage signal, and the controlled voltage signal is proportional to the output voltage signal.

5. The COT control circuit of claim 2, wherein when the DC-DC converter comprises a switching circuit having a BOOST topology, the first voltage signal comprises the output voltage signal, and the charging current signal is proportional to the output voltage signal; and wherein the second voltage signal comprises the input voltage signal and the output voltage signal, and the controlled voltage signal is proportional to the difference of the output voltage signal and the input voltage signal.

6. The COT control circuit of claim 1, wherein the synchronizing signal generator comprises:
    a first operational amplifier, having a first input terminal configured to receive a first reference voltage signal, a second input terminal connected to a logic ground through a frequency-modulated resistor, and an output terminal;
    a first transistor, having a gate coupled to the output terminal of the first operational amplifier, a source connected to the logic ground through the frequency-modulated resistor, and a drain;
    a first current mirror, having a first terminal coupled to the drain of the first transistor, and a second terminal connected to the logic ground through a frequency-modulated capacitor, and wherein the first current mirror is configured to provide the frequency-modulated signal at the second terminal of the first current mirror; and
    a second voltage comparator, having a first input terminal configured to receive a second reference voltage signal, a second input terminal coupled to the second terminal of the current mirror, and an output terminal, wherein the second voltage comparator is configured to compare the second reference voltage signal with a voltage across the frequency-modulated capacitor to generate the synchronizing signal.

7. The COT control circuit of claim 1, further comprising:
a comparing circuit, configured to receive a voltage feedback signal representative of the output voltage signal and a third voltage reference signal, and further configured to compare the voltage feedback signal with the third voltage reference signal to generate a comparing signal, the comparing signal is configured to control the off time of the at least one controllable switch of the DC-DC converter; and
a logic circuit, configured to receive the comparing signal and the on time signal, and further configured to conduct a logic operation to the comparing signal and the on time signal to generate a control signal to control the at least one controllable switch.

8. The COT control circuit of claim 3, wherein the multiplier comprises:
a Gilbert cell, configured to receive the feedback current signal and the frequency-modulated signal to generate a mirrored current signal; and
a second current mirror, configured to receive the mirrored current signal, and further configured to mirror the mirrored current signal to generate the charging current signal.

9. The COT control circuit of claim 6, wherein the frequency-modulated resistor is adjustable, and wherein the value of the frequency-modulated signal is varied with the change in the resistance of the frequency-modulated resistor, and wherein the frequency of the synchronizing signal is varied with the change in the resistance of the frequency-modulated resistor.

10. A DC-DC converter with constant on time (COT) control, wherein the DC-DC converter comprises a voltage converter integrated circuit (IC), and wherein the voltage converter IC comprises:
at least one controllable switch, wherein an input voltage signal of the DC-DC converter is converted to an output voltage signal of the DC-DC converter through switching the at least one controllable switch on and off;
a synchronizing signal generator, configured to generate a frequency-modulated signal and a synchronizing signal, wherein an operation frequency of a steady state of the DC-DC converter is regulated through changing the value of the frequency-modulated signal;
an on time generator, configured to receive the input voltage signal, the output voltage signal, an error signal and the frequency-modulated signal to generate an on time signal, wherein the on time signal is configured to control the on time of the at least one controllable switch; and
a frequency locking circuit, configured to receive the on time signal and the synchronizing signal, and further configured to compare the frequency of the on time signal with the frequency of the synchronizing signal to generate the error signal, wherein the frequency locking circuit comprises a phase locking loop (PLL), and wherein the PLL is configured to compare the frequency of the on time signal with the frequency of the synchronizing signal, and compare the phase of the on time signal with the phase of the synchronizing signal to generate the error signal.

11. The DC-DC converter with COT control of claim 10, wherein the ON time generator comprises:
a compensation current generator, configured to receive the error signal to generate a compensation current signal;
a controlled current signal generator, configured to receive the frequency-modulated signal and a first voltage signal to generate a charging current signal;
a capacitor, having a first terminal connected to an output terminal of the controlled current signal generator and an output terminal of compensation current generator, and a second terminal connected to a logic ground;
a reset switch, having a first terminal coupled to the first terminal of the capacitor, a second terminal connected to the logic ground, and a control terminal configured to receive the on time signal;
a controlled voltage signal generator, configured to receive a second voltage signal to generate a controlled voltage signal; and
a voltage comparator, having a first input terminal configured to receive the controlled voltage signal, a second input terminal coupled to the first terminal of the capacitor, and an output terminal, and further configured to compare the controlled voltage signal with a voltage across the capacitor to generate the on time signal at the output terminal of the voltage comparator.

12. The DC-DC converter with COT control of claim 10, wherein the DC-DC converter further comprises a frequency-modulated resistor connected between the voltage converter IC and a logic ground, wherein the value of the frequency-modulated signal is varied with the change in the resistance of the frequency-modulated resistor, and wherein the frequency of the synchronizing signal is varied with the change in the resistance of the frequency-modulated resistor.

13. The DC-DC converter with COT control of claim 12, wherein the synchronizing signal generator comprises:
a first operational amplifier, having a first input terminal configured to receive a first reference voltage signal, a second input terminal connected to the logic ground through the frequency-modulated resistor, and an output terminal;
a first transistor, having a gate coupled to the output terminal of the first operational amplifier, a source connected to the logic ground through the frequency-modulated resistor, and a drain;
a first current mirror, having a first terminal coupled to the drain of the first transistor, and a second terminal connected to the logic ground through a frequency-modulated capacitor, and wherein the first current mirror is configured to provide the frequency-modulated signal at the second terminal of the first current mirror; and
a second voltage comparator, having a first input terminal configured to receive a second reference voltage signal, a second input terminal coupled to the second terminal of the current mirror, and an output terminal, wherein the second voltage comparator is configured to compare the second reference voltage signal with a voltage across the frequency-modulated capacitor to generate the synchronizing signal.

14. The DC-DC converter with COT control of claim 11, wherein the controlled current signal generator comprises:
a feedback current generator, configured to receive the first voltage signal to generate a feedback current signal; and
a multiplier, configured to receive the feedback current signal and the frequency-modulated signal, and further configured to conduct a logic operation to the feedback current signal and the frequency-modulated signal to generate the charging current signal.

15. The DC-DC converter with COT control of claim 14, wherein the multiplier comprises:
   a Gilbert cell, configured to receive the feedback current signal and the frequency-modulated signal to generate a mirrored current signal; and
   a second current mirror, configured to receive the current signal, and further configured to mirror the mirrored current signal to generate the charging current signal.

\* \* \* \* \*